(12) United States Patent
Nishiyama et al.

(10) Patent No.: US 7,087,969 B2
(45) Date of Patent: Aug. 8, 2006

(54) COMPLEMENTARY FIELD EFFECT TRANSISTOR AND ITS MANUFACTURING METHOD

(75) Inventors: Akira Nishiyama, Kanagawa-ken (JP); Mizuki Ono, Kanagawa-ken (JP); Masato Koyama, Kanagawa-ken (JP); Takamitsu Ishihara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/760,501

(22) Filed: Jan. 21, 2004

(65) Prior Publication Data

US 2004/0207023 A1 Oct. 21, 2004

(30) Foreign Application Priority Data

Jan. 21, 2003 (JP) .............................. 2003-011843

(51) Int. Cl.
*H01L 29/76* (2006.01)
*H01L 31/119* (2006.01)

(52) U.S. Cl. ...................... 257/369; 257/405; 257/411; 257/645; 257/651; 257/E27.062; 257/E27.064

(58) Field of Classification Search ........ 257/E27.061, 257/E27.062, E27.064, 369, 405, 411, 645, 257/651
See application file for complete search history.

(56) References Cited

U.S. PATENT DOCUMENTS

| | | | | |
|---|---|---|---|---|
| 6,020,243 A | * | 2/2000 | Wallace et al. | ............. 438/287 |
| 6,376,888 B1 | * | 4/2002 | Tsunashima et al. | ........ 257/407 |
| 6,525,380 B1 | * | 2/2003 | Shirahata et al. | ............ 257/369 |
| 6,593,618 B1 | | 7/2003 | Kamata et al. | |
| 6,680,245 B1 | * | 1/2004 | King et al. | .................. 438/606 |
| 2002/0135030 A1 | * | 9/2002 | Horikawa | .................... 257/405 |
| 2003/0122199 A1 | * | 7/2003 | Koyama et al. | ............. 257/369 |
| 2004/0142579 A1 | * | 7/2004 | Morita et al. | ................ 438/785 |

FOREIGN PATENT DOCUMENTS

| | | |
|---|---|---|
| JP | 48-30709 | 9/1973 |
| JP | 51-45438 | 12/1976 |

* cited by examiner

*Primary Examiner*—Kenneth Parker
*Assistant Examiner*—Matthew E. Warren
(74) *Attorney, Agent, or Firm*—Oblon, Spivak, McClelland, Maier & Neustadt, P.C.

(57) ABSTRACT

A complementary field effect transistor comprises: a semiconductor substrate; an n-type field effect transistor provided on the semiconductor substrate; and a p-type field effect transistor provided on the semiconductor substrate. The n-type field effect transistor has: a first gate insulating film containing an oxide including an element selected from the group consisting of group IV metals and Lanthanoid metals, and further containing a compound of the element and a group III element; a first gate electrode provided on the first gate insulating film; and n-type source and drain regions formed on both sides of the first gate electrode. The p-type field effect transistor has: a second gate insulating film containing an oxide including an element selected from the group consisting of group IV metals and Lanthanoid metals, and including substantially no positive charge; a second gate electrode provided on the second gate insulating film; and p-type source and drain regions provided on both sides of the second gate electrode.

14 Claims, 12 Drawing Sheets

COMPLEMENTARY FIELD EFFECT TRANSISTOR AND ITS MANUFACTURING METHOD

CROSS-REFERENCE TO RELATED APPLICATIONS

This application is based upon and claims the benefit of priority from the prior Japanese Patent Application No. 2003-011843, filed on Jan. 21, 2003; the entire contents of which are incorporated herein by reference.

BACKGROUND OF THE INVENTION

The present invention relates to a complementary field effect transistor and its manufacturing method.

Large scale integration circuit (LSI) is provided with many MIS type field effect transistors (MISFETs) which have structures of metal/insulating film/semiconductor. Among MISFETs, MOSFETs using an oxide film as an insulating film have two kinds, one of which is a transistor with an n-type conductivity, and another of which is a transistor with a p-type conductivity is called CMOSFET (complementary MOSFET). CMOSFET complementarily provided with both of the transistors is usually used for LSI as a main element. Currently, the miniaturization of MOSFET is progressing and MOSFET with the gate length of 0.1 micrometers is coming soon. This is because the miniaturization of MOSFET leads to improvement in the speed of an element and leads to reduced power consumption. Moreover, since the footprint of an element is reduced by the miniaturization, many elements can be mounted on the same chip area. Consequently, multi-function LSI can be attained.

However, it is conceivable that pursuit of the miniaturization collides with a big wall bordering on 0.1 micrometers of gate length. This border arises from the limit of reducing the thickness of the gate oxide film.

Conventionally, the gate insulating film of the transistor has been demanded to have the characteristic of having high heat resistance and hardly forming an interface level in a boundary with Si of channel. $SiO_2$ which can satisfy these demands simultaneously also has the characteristic that a thin film can be formed easily controlling sufficiently. Since the relative dielectric constant of $SiO_2$ is low (3.9), it is required that the thickness of $SiO_2$ should be 3 nm or less in order to satisfy the performance of a transistor with gate length 0.1 micrometers or less. However, in such thickness, it becomes a problem that the leak current between the gate and the substrate increases when a carrier carries out direct tunneling. This problem is an essential problem of the gate insulating film using $SiO_2$, and is considered to be unavoidable.

Then, there is also technology of avoiding direct tunneling using material with a larger relative dielectric constant than $SiO_2$. $ZrO_2$, $HfO_2$ or metal oxides such as a silicate which is the compound of Zr (or Hf) and $SiO_2$ may be used as the material as disclosed in Japanese Patent Laid-Open Publication No. 2002-231942. The relative dielectric constant of the metal oxide is as high as about ten or more. Therefore, the thickness of the metal oxide can be made into twice or more of that of $SiO_2$ in order to obtain the same gate capacitance as $SiO_2$. Therefore, the direct tunneling in the gate insulating film can be pressed down.

If bias is applied to a polycrystalline silicon gate electrode, a depletion region will be generated in the gate electrode. The depletion region is mainly produced because the movable carriers at an interface with the gate insulating film are lost by applying the bias. Consequently, since the depletion region functions as an insulator substantially, the capacitance of the gate will fall. The fall of the capacitance of the gate can be avoided by using metal for the gate electrode. When one kind of metal is used for the gate electrodes of the n-type and p-type MOSFETs of CMOSFET, the threshold value of either one of the transistors becomes high, and current can not be obtained. As a result, a problem that the operation of CMOSFET became lower arises.

Although there is also a method of properly using appropriate different metals for the n-type MOSFET and the p-type MOSFET, the manufacturing process may be complicated and may cause a cost rise. Moreover, the method of using different metals may have a practical problem. For example, it is necessary to choose the material which does not cause a reaction mutually as the gate metal of the n-type MOSFET and the gate metal of the p-type MOSFET, or to choose the material with which the gate metal formed previously is not deleted by etching of the gate metal formed afterward.

Furthermore, there is a problem that the appropriate metal materials for the gate electrode of the n-type MOSFET may have another drawback. The appropriate materials for the metal gate electrode of the n-type MOSFET are metals such as Al, Zr, Hf, etc. whose work functions are about 4 eV. Such metals have possibilities that they may become oxides by heat treatment after forming the electrode, and the conductivities may fall rapidly. Moreover, there also may be a problem that gate leak current is raised since the material which is easy to be oxidized reduces the insulating film of the gate. For example, besides Al, the resistivity of Mn is as high as 200 μΩcm, and the silicide such as $ErSi_2$ also tends to be oxidized to the same degree as aluminum etc.

As explained above, conventional CMOSLSI using the metal gate electrode has the problem of causing low-speed operation, when the same metal material is used for the gate electrodes of the n-type and the p-type MOSFETs. Moreover, when different materials are used for the gate electrodes of the n-type and the p-type MOSFETs, there may be problems that the manufacturing process becomes complicated, cost goes up and, no combination of suitable materials is found.

SUMMARY OF THE INVENTION

According to an aspect of the invention, there is provided a complementary field effect transistor comprising: a semiconductor substrate; an n-type field effect transistor provided on the semiconductor substrate having: a first gate insulating film containing an oxide including an element selected from the group consisting of group IV metals and Lanthanoid metals, and further containing a compound of the element and a group III element except aluminum; a first gate electrode provided on the first gate insulating film; and n-type source and drain regions formed on both sides of the first gate electrode; and a p-type field effect transistor provided on the semiconductor substrate having: a second gate insulating film containing an oxide including an element selected from the group consisting of group IV metals and Lanthanoid metals, and substantially containing none of group III element except aluminum; a second gate electrode provided on the second gate insulating film; and p-type source and drain regions provided on both sides of the second gate electrode.

According to other aspect of the invention, there is provided a complementary field effect transistor comprising:

a semiconductor substrate; an n-type field effect transistor provided on the semiconductor substrate having: a first gate insulating film containing an oxide including an element selected from the group consisting of group IV metals and Lanthanoid metals, and substantially containing none of group V elements and aluminum; a first gate electrode provided on the first gate insulating film; and n-type source and drain regions formed on both sides of the first gate electrode; and a p-type field effect transistor provided on the semiconductor substrate having: a second gate insulating film containing an oxide including an element selected from the group consisting of group IV metals and Lanthanoid metals, and further containing a compound of the element and a group V element or aluminum; a second gate electrode provided on the second gate insulating film; and p-type source and drain regions provided on both sides of the second gate electrode.

According to other aspect of the invention, there is provided a manufacturing method of complementary field effect transistor comprising: forming an oxide film to be made into gate insulating films including an element selected from the group consisting of group IV metals and Lanthanoid metals on regions for an n-type field effect transistor and a p-type field effect transistor on -a semiconductor substrate; forming a metal film to be made into gate electrodes of the n-type field effect transistor and the p-type field effect transistor on the oxide film; and introducing group III element except aluminum into the oxide film of the region for the n-type field effect transistor selectively.

According to other aspect of the invention, there is provided a manufacturing method of complementary field effect transistor comprising: forming an oxide film to be made into gate insulating films including an element selected from the group consisting of group IV metals and Lanthanoid metals on regions for an n-type field effect transistor and a p-type field effect transistor on a semiconductor substrate; forming a metal film to be made into gate electrodes of the n-type field effect transistor and the p-type field effect transistor on the oxide film; and introducing at least one of group V elements and aluminum into the oxide film of the region for the p-type field effect transistor selectively.

BRIEF DESCRIPTION OF THE DRAWINGS

The present invention will be understood more fully from the detailed description given here below and from the accompanying drawings of the embodiments of the invention. However, the drawings are not intended to imply limitation of the invention to a specific embodiment, but are for explanation and understanding only.

In the drawings.

DETAILED DESCRIPTION

Figures 1, 2:
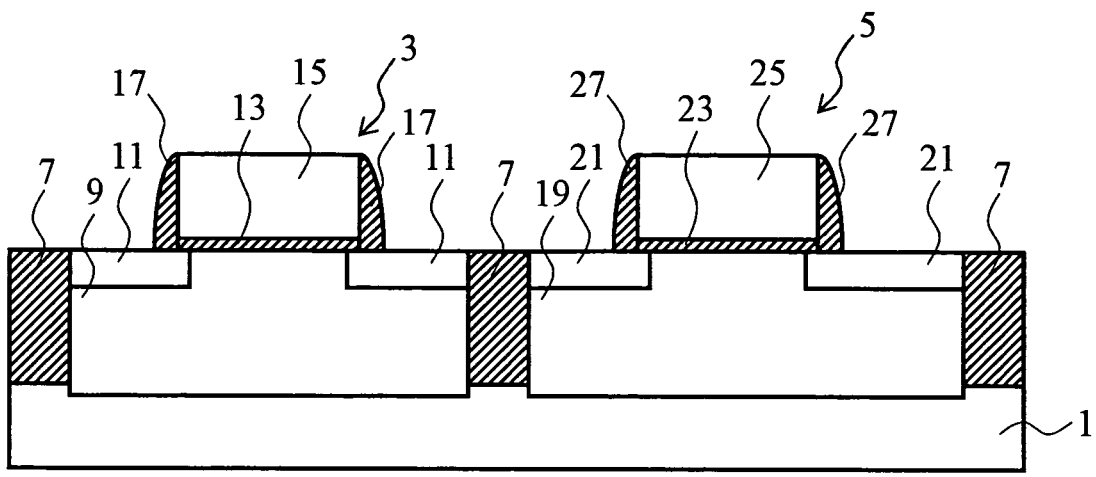
FIG. 1 is a section view of complementary MISFETs provided with an n-type MISFET and a p-type MISFET according to the first embodiment of the invention.
FIG. 2 is a graphical representation showing an experimental result by the Inventors about a capacitor consisted of a polycrystalline $p^+$-type Si electrode/a hafnium silicate (HfSiON) gate insulating film/a p-type Si substrate.

Referring to the drawings, some embodiments of the present invention will now be described in detail. The same symbols are given to the same elements, and with regard to the same elements, detailed explanation will be omitted. Moreover, shapes, sizes, ratios, etc. of devices in schematic diagrams may be different from those of actual devices. But, concrete shapes and concrete sizes can be known referring to following explanations and well-known technologies.

FIG. 1 is a section view of a CMISFET provided with an n-type MISFET and a p-type MISFET according to the first embodiment of the invention.

The CMISFET of the first embodiment is provided with the n-type MISFET 3 and the p-type MISFET 5 formed on the same semiconductor substrate 1. An isolation region 7 is formed between two transistors on the semiconductor substrate 1 by embedding an insulating film in a slot.

The n-type MISFET 3 is formed on a p-type well 9 which is on the semiconductor substrate 1. The n-type MISFET 3 is provided with a pair of n-type source/drain regions 11 which is formed on the p-type well 9 and forms a junction with the p-type well 9. Moreover, the n-type MISFET 3 is sandwiched between the n-type source/drain regions 11, and is provided with a gate insulating film 13 and a gate electrode 15 which are formed on the semiconductor substrate 1 in this order.

The p-type MISFET 5 is formed on an n-type well 19 which is on the semiconductor substrate 1. The p-type MISFET 5 is provided with a pair of p-type source/drain regions 21 which is formed on the n-type well 19 and makes a junction with the n-type well 19. Moreover, the p-type MISFET 5 is sandwiched between the p-type source/drain regions 21, and is provided with a gate insulating film 23 and a gate electrode 25 which are formed on the semiconductor substrate 1 in this order.

Although the two MISFETs expressed in FIG. 1 are provided with gate side wall insulating films 17 and 27, these insulating films may be omitted. A figure showing a plane perpendicular to the section view of FIG. 1 (section perpendicular to the space of FIG. 1) and its explanation are omitted because they are common to CMISFET and are known widely.

The gate electrode 15 of the n-type MISFET 3 may be made of polycrystalline p$^+$-type silicon including boron (B). On the other hand, the gate electrode 25 of the p-type MISFET 5 may be made of polycrystalline n$^+$-type silicon including arsenic (As). Alternatively, the gate electrodes 15 and 25 may be made of metallic element.

The gate insulating film 13 of the n-type MISFET 3 is made of hafnium silicate (HfSiON) including boron (B) As will be explained in full detail later, boron included in the gate insulating film 13 has come from the gate electrode 15. By incorporating boron and hafnium in the gate insulating film 13, positive charge can be generated therein. On the other hand, the gate insulating film 23 of the p-type MISFET 5 is made of hafnium silicate which does not substantially include boron.

By generating positive charge by incorporating boron and hafnium in the gate insulating film 13, the threshold of the n-type MISFET 3 can be appropriately adjusted. As a result, the thresholds of the n-type MISFET 3 and the p-type MISFET 5 may be appropriately balanced.

FIG. 2 shows the experimental result by the Inventors about a capacitor consisting of a polycrystalline p$^+$-type Si electrode/a hafnium silicate (HfSiON) gate insulating film/a p-type Si substrate. In this experiment, the change of the flat band voltage Vfb (vertical axis of FIG. 2) at which the bending of the energy band is not occurred by an electric field versus the concentration of hafnium in gate oxide (horizontal axis of FIG. 2) was investigated. Boron (B) is added as an impurity in the polycrystalline Si electrode.

The result of this experiment showed that positive charge was formed in the film and Vfb changes with the rise of the hafnium concentration in the gate insulating film. On the other hand, the change of Vfb was not seen in the n-type polycrystalline Si electrode in which arsenic (As) or phosphorous (P) is added.

Therefore, it is considered that boron in the Si electrode moves into the gate insulating film, positive charge is generated by the coupling of Hf and boron (B) in the gate insulating film, and this positive charge change the Vfb. This is occurred with the mechanism that the gate insulating film is positively charged since the numbers of bonding hands of Hf in group IV elements and that of boron (B) in group III elements are different from each other and one bonding hand of Hf remains unbonded. The threshold values of two transistors can be made into a suitable value by forming the hafnium-boron (HfB) compound only in the n-type MOSFET and using the same metal for the gate electrodes of two transistors using this phenomenon. This effect is an effect peculiar to the oxide containing the compound of group IV metal and group III metal (except aluminum). As will be explained later as a transformation of the embodiment, aluminum generates negative charge when incorporated in an oxide.

Figure 3A:
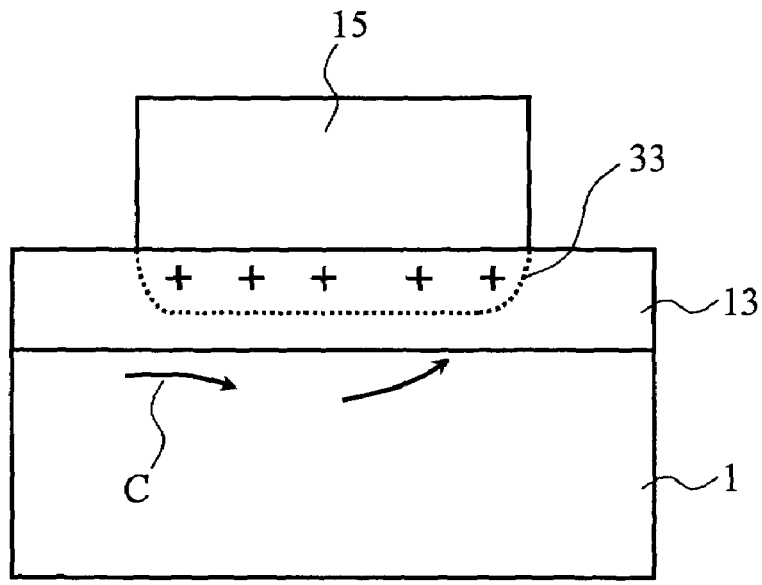
FIG. 3A is a figure showing the mobility degradation of the electric charge running along the interface at the gate insulating film.

In addition, it is desirable that the positive electric charge in the gate insulating film is localized near the gate electrode. This is because the following reason. When an electric charge exists in the gate insulating film 13 in FIG. 3A, the electric charge c to transmit the signal which runs along the connection side with the gate insulating film 13 in the semiconductor substrate 1 will receive scattering by the Coulomb field of the positive charge in the gate insulating film 13. Consequently, the mobility (running speed) of the electric charge in the semiconductor substrate 1 decreases, the driving force of MOSFET decreases, and the operation speed of CMOSFET falls. The Coulomb field on the surface of the substrate by the electric charge in the gate insulating film becomes smaller, as the electric charge in the gate insulating film moves away from the interface between the substrate and the insulating film. Therefore, the fall of the operation speed by the Coulomb filed can be prevented by making positive charge localized in the region near the interface 33 with the gate electrode. That is, it is desirable that the compound of hafnium (Hf) and boron (B) may be distributed close to the gate electrode 15 in the gate insulating film 13.

Figure 3B:
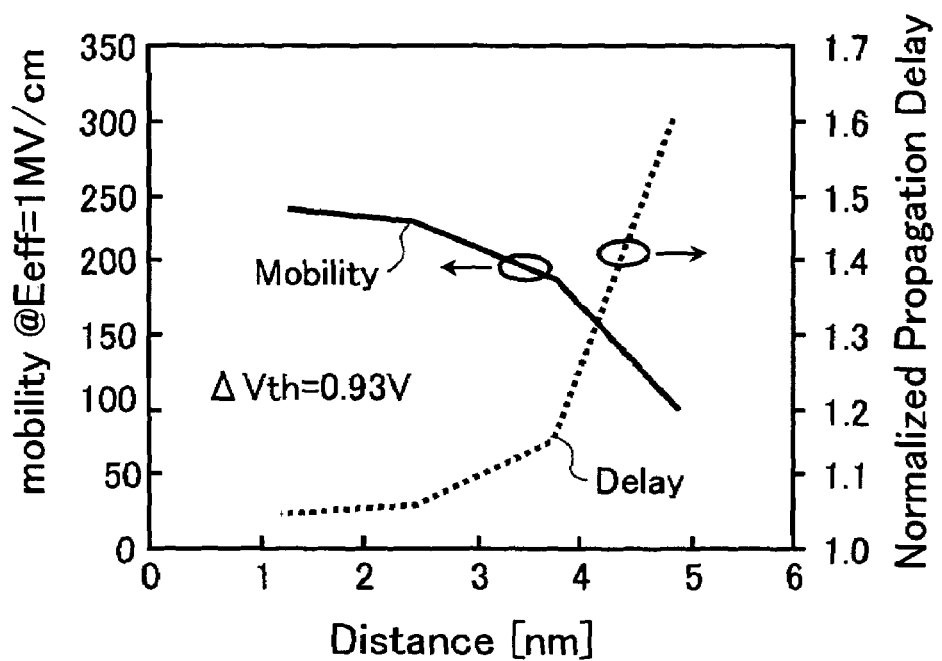
FIG. 3B is a graphical representation showing a relation between the distance of the gate electrode from the interface and the mobility of the electric charge which runs along the interface, and a relation between the distance of the gate electrode from the interface and the propagation delay.

FIG. 3B is a graphical representation showing an effect of the distance between the electric charge and the gate electrode. That is, the horizontal axis shows the distance between the electric charge and the interface between the gate electrode and the gate insulating film. The vertical axis on the left shows the mobility, and the vertical axis on the right shows the normalized propagation delay of the CMISFET in the case where the change of the threshold value $\Delta V_{th}$=0.93V with the high dielectric gate insulating film of 5 nm thickness and having a relative dielectric constant 20. From FIG. 3B, it can be seen that the mobility (running speed) is higher and the operation speed of MOSFET becomes faster, as the electric charge is closer to the interface with the gate electrode.

In another example of the first embodiment of the invention, the gate insulating film 13 of the n-type MISFET 3 may be made of hafnium silicate (HfSiON) including arsenic (As). As will be explained in full detail later, arsenic included in the gate insulating film 13 has come from the gate electrode 15. By incorporating arsenic and hafnium in the gate insulating film 13, negative charge can be generated therein.

On the other hand, the gate insulating film 23 of the p-type MISFET 5 is made of hafnium silicate which does not substantially include arsenic.

By generating negative charge by incorporating arsenic and hafnium in the gate insulating film 13, the threshold of the p-type MISFET 5 can be appropriately adjusted. As a result, the thresholds of the n-type MISFET 3 and the p-type MISFET 5 may be appropriately balanced. The same effect can be acquired by using at least one of other group V elements and aluminum instead of arsenic.

FIG. 4A through FIG. 4D, FIG. 5A through FIG. 5C, FIG. 6A through FIG. 6C, and FIG. 7 are section views for explaining the manufacturing method of CMISFET and CMISFET manufactured by this method according to the second embodiment of the invention.

Figure 4A:
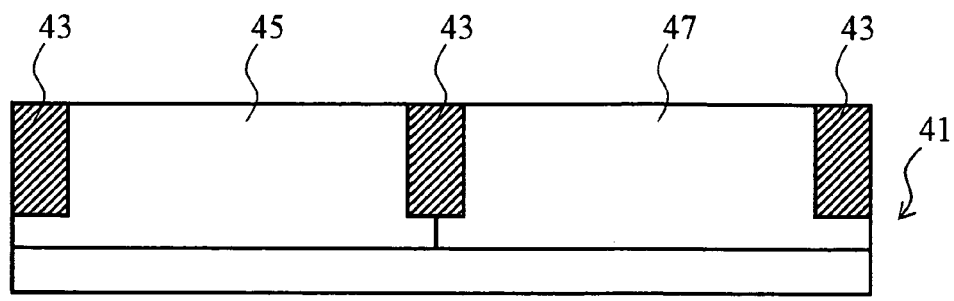
FIG. 4A through FIG. 4D are section views for explaining the manufacturing method of CMISFET according to the second embodiment of the invention.
Figure 4B:
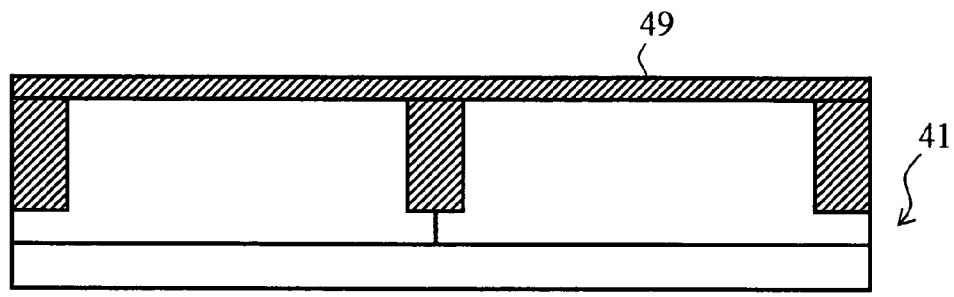

First, a plurality of shallow trench isolations 43 with shallow slot shape are formed at some distance from each other in the Si substrate 41 as expressed in FIG. 4A. These shallow trench isolations 43 are formed by forming trenches with depth of about 0.4 micrometers on the surface of the Si substrate 41, forming SiO$_2$ on the surface of the Si substrate 41 by the CVD method, and planarizing the surface by CMP (Chemical Mechanical Polishing).

Then, the deep diffusion layers of the p-type and the n-type are formed by performing high temperature short-time heat treatment (rapid thermal annealing) about 1100 degrees centigrade after performing an ion implantation of several MeV to each transistor region on the Si substrate 41 and adding impurities. The p-type diffusion layer corresponds to the p-type well 45 formed in the region for the n-type MISFET, and the n-type diffusion layer corresponds to the n-type well 47 formed in the region for p-type MISFET in FIG. 4A.

Then, the ion implantation for adjustment of the threshold values is performed to the each region for each MISFET. Furthermore, the film 49 of a mixture of a hafnium oxide and a silicon oxide used as the gate insulating film is formed at about 500 degrees centigrade by the MOCVD (Metalorganic CVD) method at the thickness of about 4 nm on the Si substrate 41 as expressed in FIG. 4B. Here, it is desirable that the concentration of Hf in the mixed film 49 is in the range between about 20% and about 50%, however, the concentration is not to be limited in the range but the concentration may be out of this range.

Then, nitrogen is introduced into this film by exposing the mixed film 49 to nitrogen plasma. Here, it is desirable that the nitrogen concentration is in the range between about 20% and about 40%, but the concentration may be out of this range. In addition, this nitrogen introduction process may also be skipped.

Figure 4C:
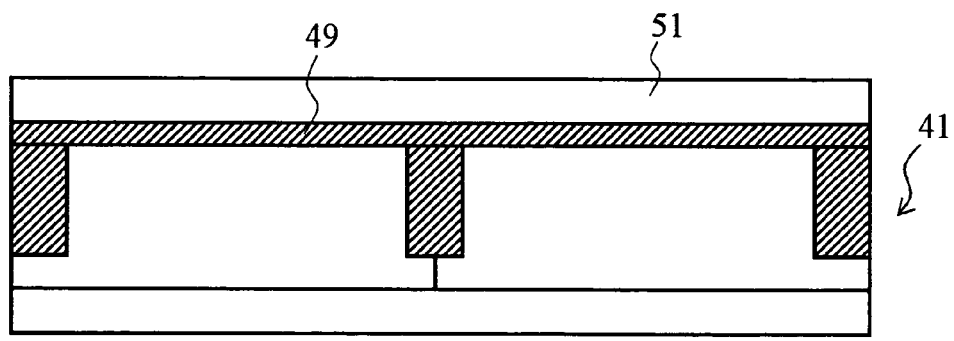
Figure 4D:
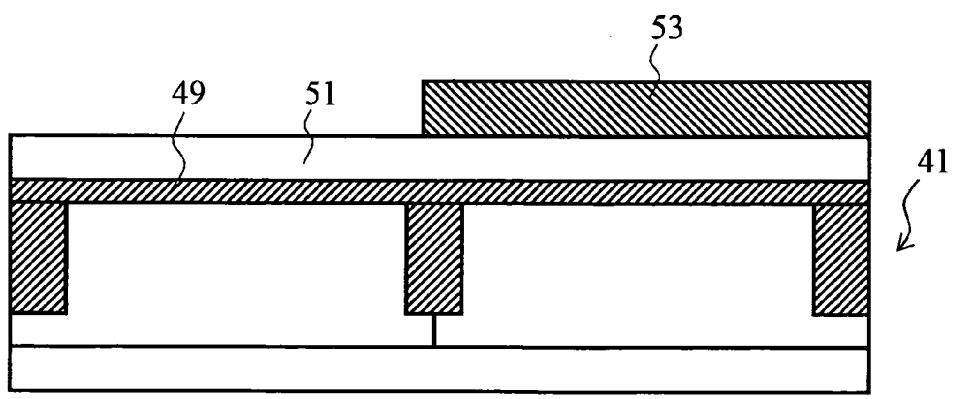

Then, the molybdenum (Mo) film 51 is formed on the mixed film 49 as expressed in FIG. 4C. The Mo film 51 is formed by the CVD method using the halogen gas of Mo or the organic system gas. Next, a resist 53 is formed in the region for the p-type MISFET by a photolithography as expressed in FIG. 4D.

Figure 5A:
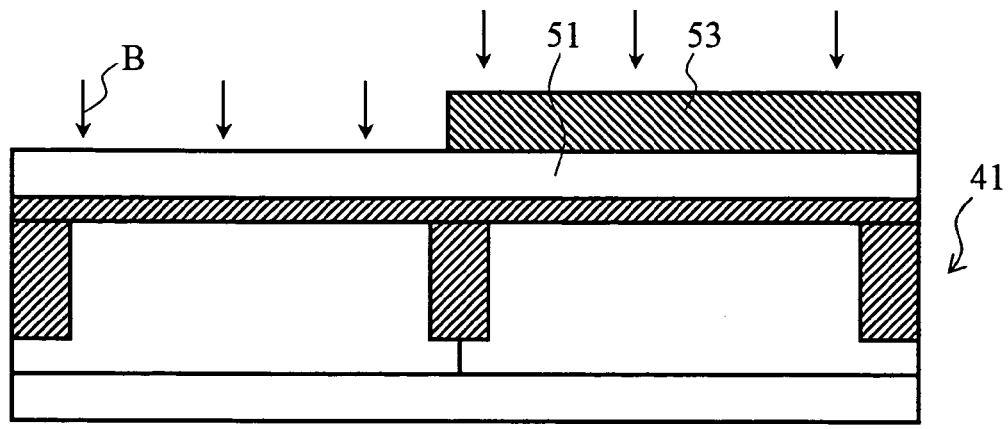
FIG. 5A through FIG. 5C are section views for explaining the manufacturing method of CMISFET according to the second embodiment of the invention.
Figure 5B:
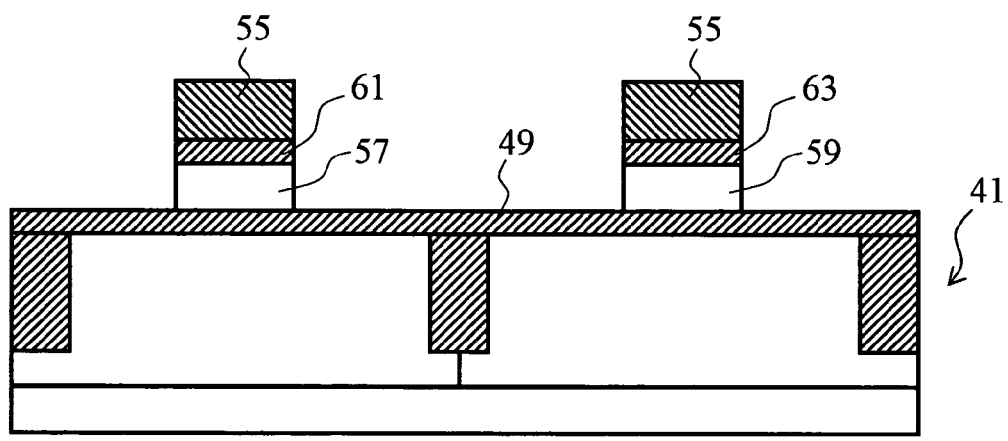

Then, the ion implantation of the boron (B) ion is carried out to the surface of the Si substrate 41 as expressed in FIG. 5A. Then, the ion implantation of the boron (B) can be carried out only to the Mo film 51 of the region for the n-type MISFET of Mo films of regions for the n-type and the p-type MISFETs. The dose amount of this ion implantation is about $1\times10^{16}$ cm$^{-2}$, and energy is about 50 KeV. These values can be appropriately changed within ranges in which the threshold values are changed effectively. A diborane ($B_2H_6$) or a decaborane ($B_{10}H_{14}$) can also be used instead of elementary boron (B).

Then, the resist 53 is removed by ashing and a silicon nitride film is formed by the CVD method on the Si substrate 41. And the resist 55 is formed in the regions for the gate electrodes on the silicon nitride film using the photolithography as expressed in FIG. 5B. Here, the resist 55 is formed in a stripe fashion so that the longitudinal directions of the resists 55 are in agreement with the perpendicular direction to the space of FIG. 5B. The silicon nitride film and Mo film which are not covered with the resists 55 are removed by etching using the resists 55 as mask. Then, the gate electrodes 57 and 59 of Mo and the silicon nitride films 61 and 63 on the electrodes are formed as expressed in FIG. 5B.

Figure 5C:
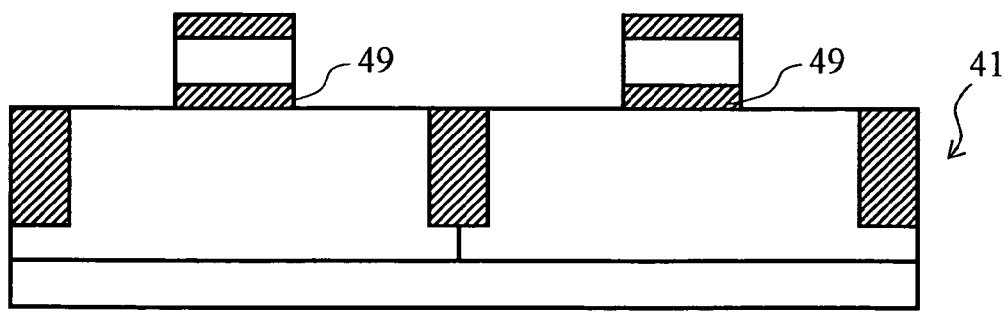

Then, the mixed film 49 which is not covered with the resists 55 is removed by dipping in dilute hydrofluoric-acid etching solution as expressed in FIG. 5C. Then, the resists 55 are removed as expressed in FIG. 5C.

Figure 6A:
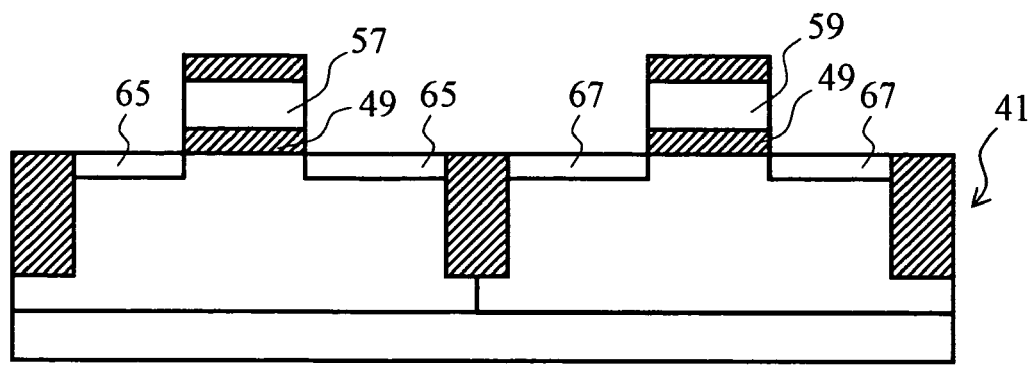
FIG. 6A through FIG. 6C are section views for explaining the manufacturing method of CMISFET according to the second embodiment of the invention.

Next, the shallow ion implantation regions 65 and 67 are formed by carrying out the ion implantation of As and BF$_2$ to the region for the source/drain regions of the n-type MISFET and the p-type MISFET, respectively, as expressed in FIG. 6A. Then, boron (B) contained in the Mo film 57 of the n-type MISFET is diffused into the mixed film 49 by a heat treatment in nitrogen atmosphere at about 600 degrees centigrade. Boron (B) entering into the mixed film 49 of the n-type MISFET by this diffusion process forms a compound with Hf.

Figure 6B:
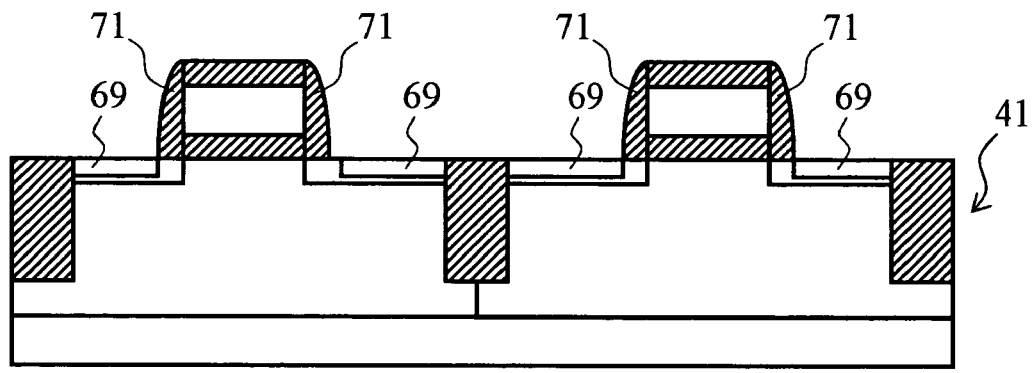

Then, SiO$_2$ film is formed by the CVD method on the Si substrate 41, and the SiO$_2$ films 71 are left on the side walls of the Mo films 57 and 59 by reactive ion etching (RIE) as expressed in FIG. 6B.

Next, the ion implantation of As is carried out to the region for the n-type MISFET, and the ion implantation of BF$_2$ is carried out to the region for the p-type MISFET. Then, heat treatment of about 400 degrees centigrade or more is performed for activation of impurities, and thus, the deep source/drain regions are formed. It is desirable that this heat treatment is a short-time high temperature processing (rapid thermal annealing) like a condition of at about 1000 degrees centigrade and for about 20 seconds. Then, cobalt (Co) film is formed on the Si substrate 41, and silicon and Co are made to react by a heat treatment of about 400 degrees centigrade. Then, unreacted Co is removed by etching with the mixed-solution of sulfuric acid and hydrogen peroxide solution, short-time heat treatment at about 700 degrees centigrade is performed, and thus, CoSi$_2$ film 69 is formed on the source/drain regions of two MISFETs as expressed in FIG. 6B.

Figure 6C:
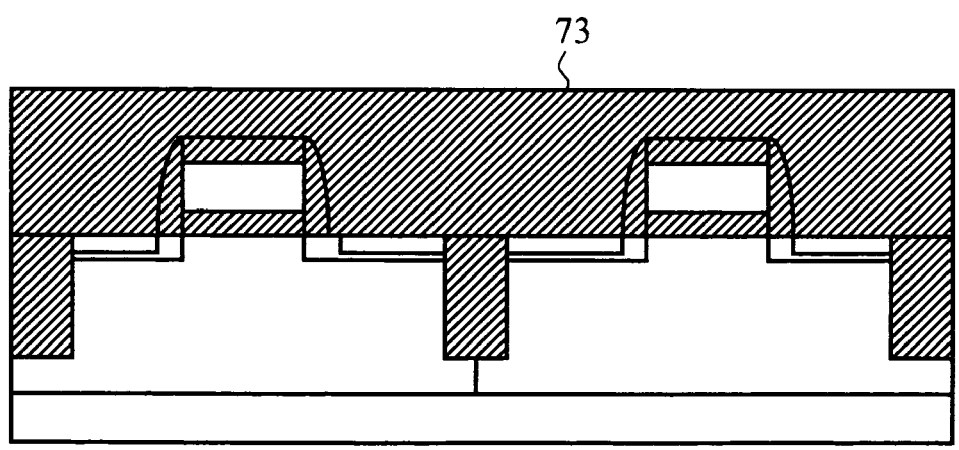
Figure 7:
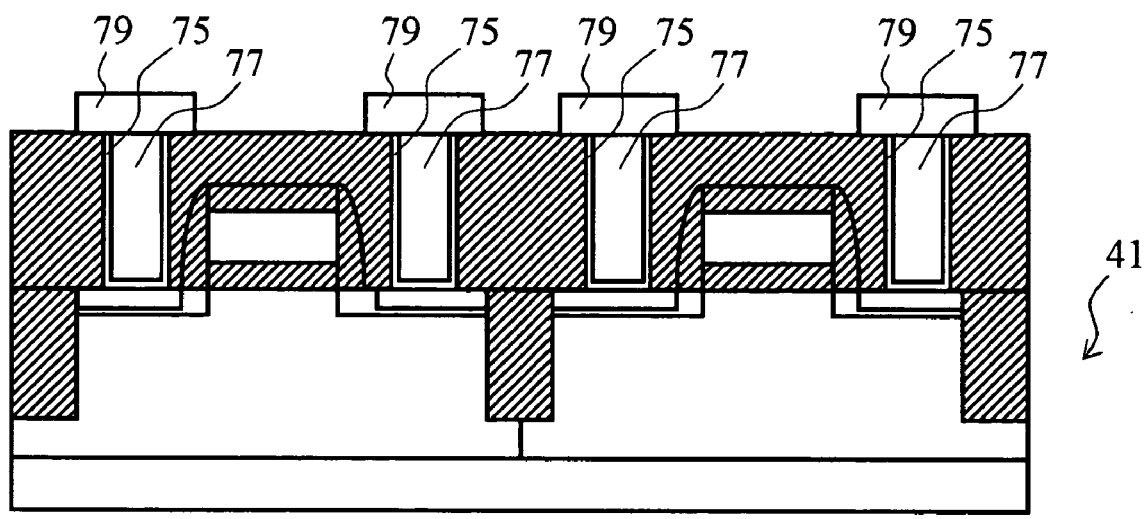
FIG. 7 is a section view for explaining the manufacturing method of CMISFET according to the second embodiment of the invention.

Next, SiO$_2$ film 73 used as the insulating interlayer film is formed by the CVD method on the Si substrate 41 as expressed in FIG. 6C.

And, the openings for connections which reach the source/drain regions are opened in SiO$_2$ film 73, and the TiN films as barrier metals are formed by the CVD method. Furthermore, tungsten (W) films are formed on the TiN films and the TiN films 75 and the W films 77 are left in the openings for connection by CMP as expressed in FIG. 7. And, the laminated films 79 of Al layer and Cu layer contacted to the W films 75 are formed by laminating Al layer and Cu layer in this order and processing by a photolithography as expressed in FIG. 7. And, LSI is completed by forming elements which connect with CMISFET and upper wirings.

By the above method, group III element can be selectively introduced only into the gate insulating film of the n-type MISFET.

In a transformation of the above-explained method, arsenic may be used instead of boron. That is, the above-mentioned process can be performed by using arsenic instead of using boron. In this transformation, arsenic is selectively introduced into the insulating film of the p-type MOSFET. Arsenic is not introduced into the insulating film of the n-type MOSFET.

Instead of arsenic, at least one of other group V elements and aluminum can be introduced into the insulating film of the p-type MOSFET.

FIG. 8A through FIG. 8D and FIG. 9 are section views for explaining the manufacturing method of CMISFET and CMISFET manufactured by the manufacturing method according to the third embodiment of the invention.

Figure 8A:
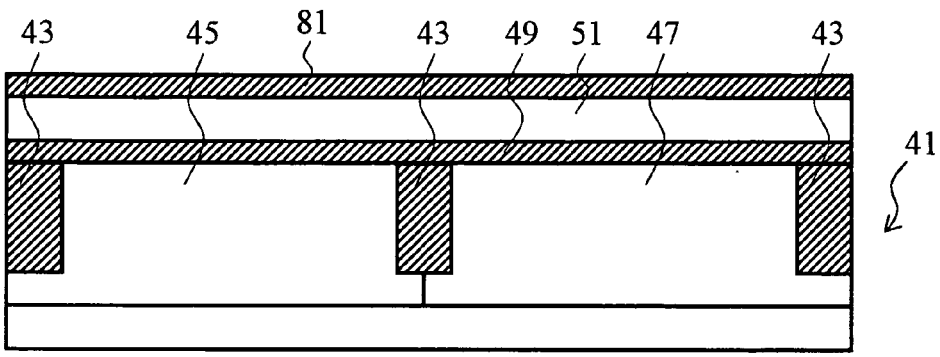
FIG. 8A through FIG. 8D are section views for explaining the manufacturing method of CMISFET according to the third embodiment of the invention.

First, the isolation regions 43, the p-type well 45, the n-type well 47, the mixed film 49, and the molybdenum (Mo) film 51 are formed on the Si substrate 41 by the same method as the second embodiment as expressed in FIG. 8A. And, the silicon nitride film 81 is formed on the Mo film 51 as expressed in FIG. 8A.

Figure 8B:
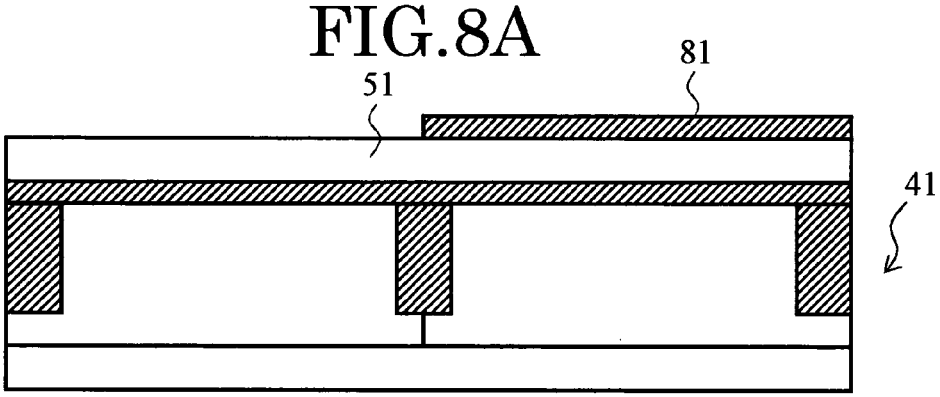

Then, the resist which covers the silicon nitride film 81 on the region for the p-type MISFET by photolithography is formed, and the silicon nitride film on the region for the n-type MISFET is removed selectively as expressed in FIG. 8B.

Figure 8C:
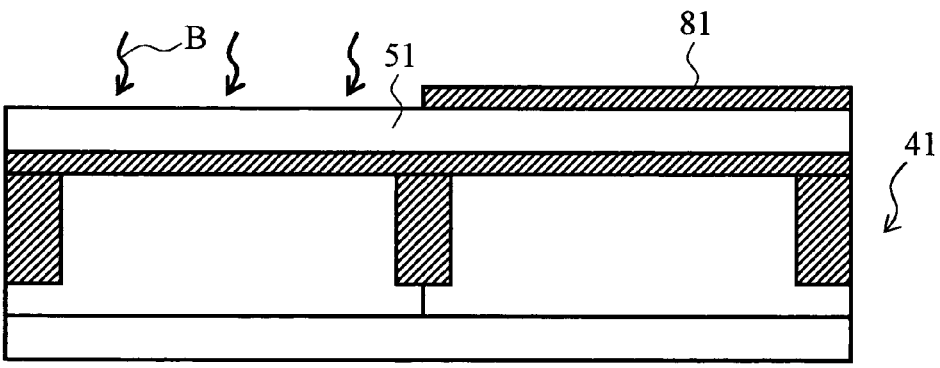
Figure 8D:
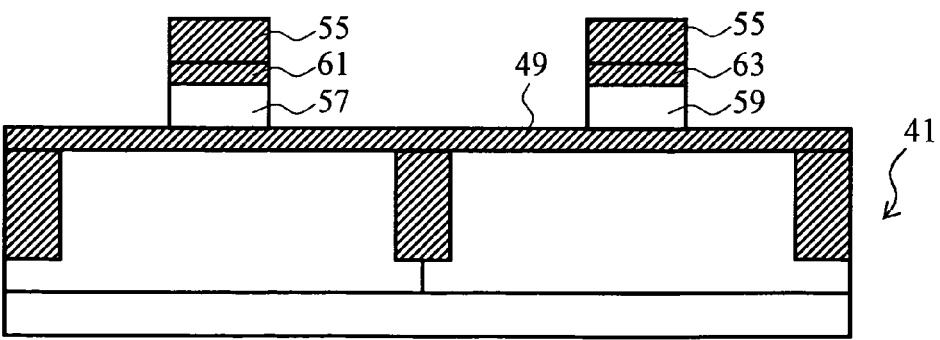

Then, boron (B) with the density of about $1\times10^{16}$ cm$^{-2}$ is adsorbed on the surface of the Si substrate 41 by heating the substrate at about 300 degrees centigrade in B$_2$H$_6$ atmosphere as expressed in FIG. 8C. The value of the density can be changed appropriately within a range in which the threshold value changes effectively. Decaborane ($B_{10}H_{14}$) etc. can also be used for adsorption of boron (B) instead of diborane ($B_2H_6$). Or, boron (B) may be made to vapor-deposit instead of adsorption. Then, $CF_4$ plasma removes the silicon nitride film 81. Thereby, boron (B) can be selectively introduced only into the Mo film 51 of the region for the n-type MISFET of the regions for the n-type and the p-type MISFETs.

Then, the silicon nitride film is formed by the CVD method on the Mo film 51. And etching removal of the silicon nitride film and the Mo film is carried out using the resist 55 formed by the photolithography as a mask. And the gate electrodes 57 and 59 which consist of the Mo film and the silicon nitride films 61 and 63 on the electrodes are formed in a strip-of-paper fashion as expressed in FIG. 8D.

Then, the portion which is not covered by the gate electrodes 57 and 59 of the mixed film 49 is removed by etching using dilute hydrofluoric-acid solution. And after removing the resists 55, shallow source/drain regions 65 and 67 are formed like the second embodiment. Then, boron (B) which is made to adsorb or vapor-deposit is made to diffuse into the mixed film 49 left behind under the gate electrode 57 by the same heat treatment as the second embodiment. And the compound of Hf and boron (B) is formed in the mixed film 49 processed into the form of the gate insulating film.

Figure 9:
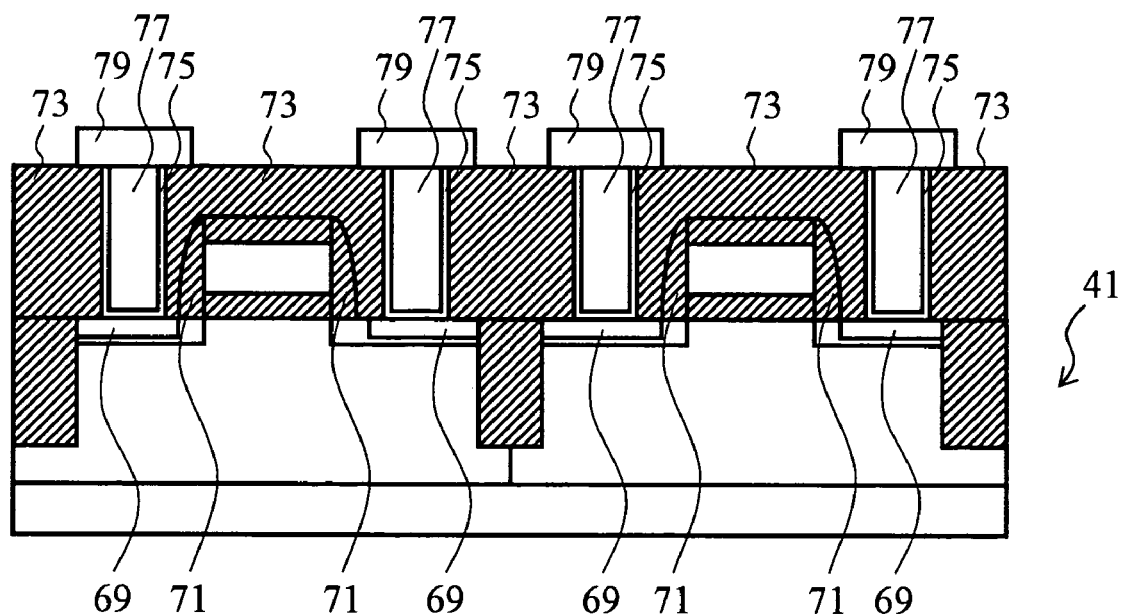
FIG. 9 is a section view for explaining the manufacturing method of CMISFET according to the third embodiment of the invention.

Then, as the first embodiment, the side walls 71, deep source/drain regions, $CoSi_2$ film 69, $SiO_2$ film 73, TiN films 75, the W films 77, and the laminated films 79 of Al layer and Cu layer are formed, and the formations of CMISFET of this embodiment and wirings connected to this CMISFET are completed as expressed in FIG. 9.

In this embodiment, aluminum (Al), gallium (Ga), indium (In), etc. can be used instead of boron (B) as a metal which combines with the metal in the gate insulating film, and generates positive charge. The gas suitable for each material can be used for adsorption of such material.

Since the group III element can be introduced without using ion implantation by the method of the third embodiment, the method of the third embodiment is a simpler process.

In a case of a transformation of the above-explained method, arsenic (As) may be used instead of boron. That is, the above-mentioned process can be performed by using arsenic instead of using boron. In this transformation, arsenic is selectively introduced into the insulating film of the p-type MOSFET. Arsenic is not introduced into the insulating film of the n-type MOSFET.

Further, as metal element in order to generate negative charge, at least one of other group V elements and aluminum can be introduced into the insulating film of the p-type MOSFET. For example, phosphorous (P), antimony (Sb) or aluminum (Al) can be used instead of arsenic. Appropriate gas may be used in order to make the element adsorb.

FIG. 10A through FIG. 10D are section views for explaining the manufacturing method of CMISFET and CMISFET manufactured by this method according to the fourth embodiment of the invention.

Figure 10A:
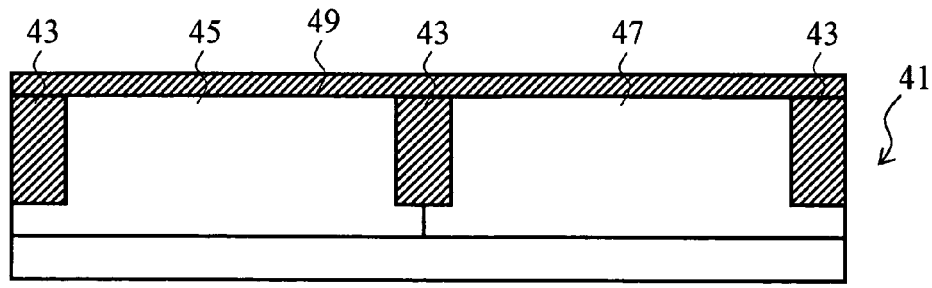
FIG. 10A through FIG. 10D are section views for explaining the manufacturing method of CMISFET according to the forth embodiment of the invention.
Figure 10B:
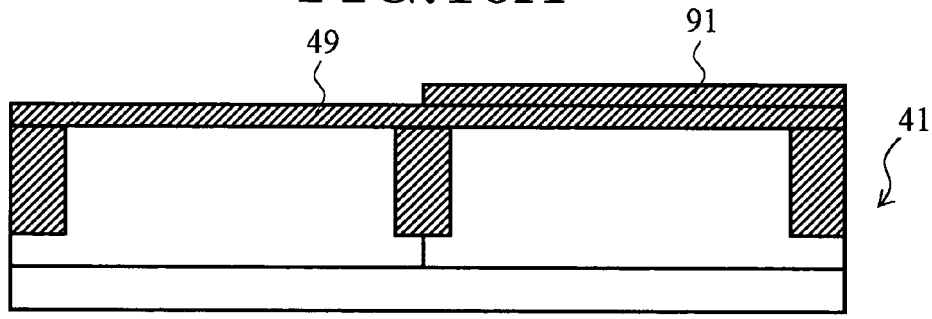

First, isolation regions 43, the p-type well 45, the n-type well 47, and the mixed film 49 are formed on the Si substrate 41 like the second embodiment as expressed in FIG. 10A.

Then, the silicon nitride film 91 which covers the region for the p-type MISFET is formed as expressed in FIG. 10A. And boron (B) with the density of about $1 \times 10^{16}$ cm$^{-2}$ is made to adsorb onto the mixed film 49 of the region for the n-type MISFET by heating the Si substrate 41 at about 300 degrees centigrade exposing the surface of the substrate in the atmosphere of $B_2H_6$. The value of the density can be changed appropriately within a range in which the threshold value changes effectively. Then, $CF_4$ plasma removes the silicon nitride film 91 from on the Si substrate 41. Decaborane ($B_{10}H_{14}$) etc. may be used as boron (B) to adsorb instead of diborane ($B_2H_6$) and boron (B) may be made to vapor-deposit on the mixed film 49 directly.

Figure 10C:
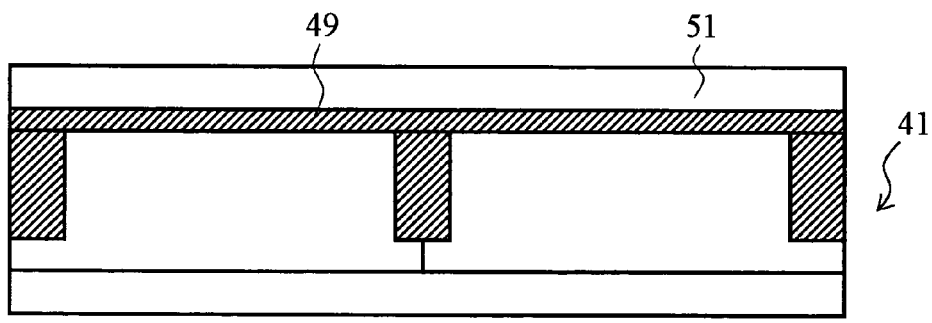

Then, the Mo film 51 used as a gate electrode is formed on the mixed film 49 by the CVD method using halogen gas or the gas of an organic system as expressed in FIG. 10C.

Then, a silicon nitride film is formed on the Mo film 51 by the CVD method. And the resist adjusted in the gate electrode positions on the silicon nitride film using the photolithography is formed. And a patterning process of the silicon nitride film and the Mo film 51 is carried out using the resist as a mask. And the silicon nitride films 61 and the gate electrodes 57 and 59 of Mo are formed as expressed in FIG. 10D. Then, a patterning process of the gate insulating films 49 which consist of mixed films are carried out using the gate electrodes 57 and 59 as a mask.

Then, $SiO_2$ films 71 Qf the wall of the gate electrode sides, the shallow source/drain regions 65 and 67, $CoSi_2$ film 69, and $SiO_2$ film 73 etc. are formed like the second embodiment. In this embodiment, after making boron (B) adsorb or vapor-deposit on the region for the n-type MISFET of the mixed film 49, the Mo film 51 is formed. Therefore, in this embodiment, the heat treatment for diffusing boron (B) from the Mo film 51 into the mixed film 49 performed by the second and the third embodiment is omitted.

Figure 10D:
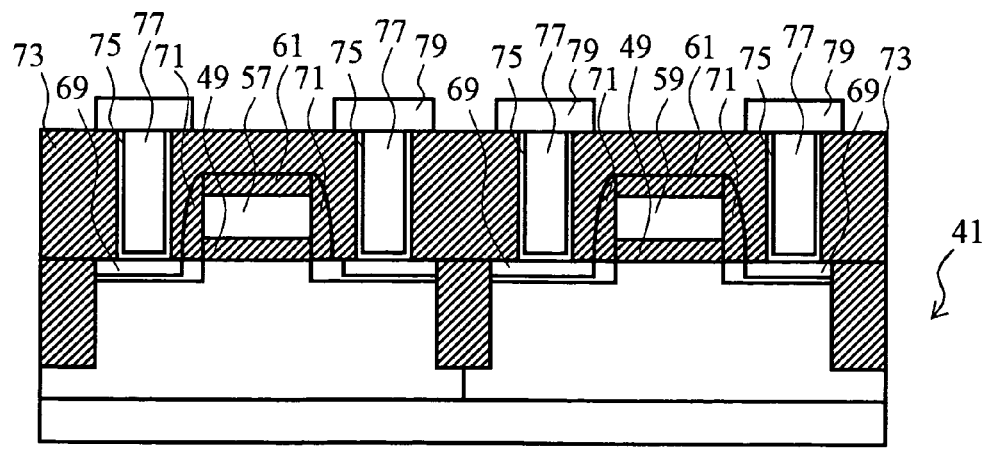

Then, as the second embodiment, TiN films 75, the W films 77, and the laminated films 79 of aluminum (Al) layer and copper (Cu) layer are formed, and the formations of CMISFET of this embodiment and wirings connected to this CMISFET are completed as expressed in FIG. 10D.

In a case of a transformation of the above-explained method, arsenic (As) may be used instead of boron. That is, the above-mentioned process can be performed by using arsenic instead of using boron. In this transformation, arsenic is selectively introduced into the insulating film of the p-type MOSFET. Arsenic is not introduced into the insulating film of the n-type MOSFET.

Further, as metal element in order to generate negative charge, at least one of other group V elements and aluminum can be introduced into the insulating film of the p-type MOSFET. For example, phosphorous (P), antimony (Sb) or aluminum (Al) can be used instead of arsenic. Appropriate gas may be used in order to make the element adsorb.

Figure 11A:
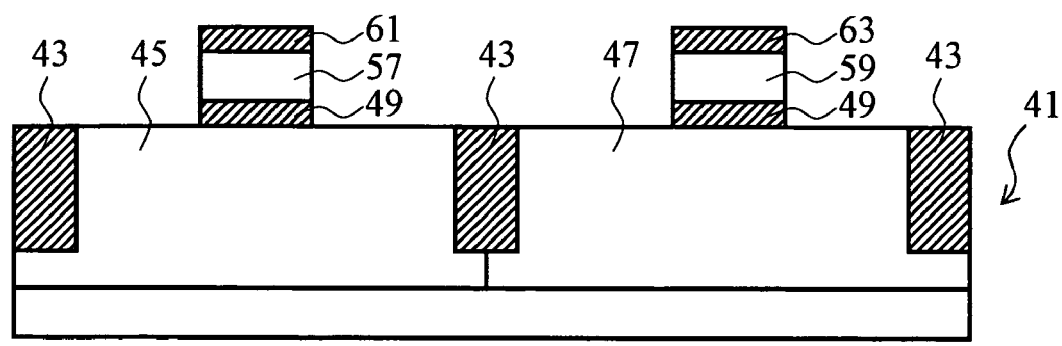
FIG. 11A and FIG. 11B are section views for explaining the manufacturing method of CMISFET according to the fifth embodiment of the invention.
Figure 11B:
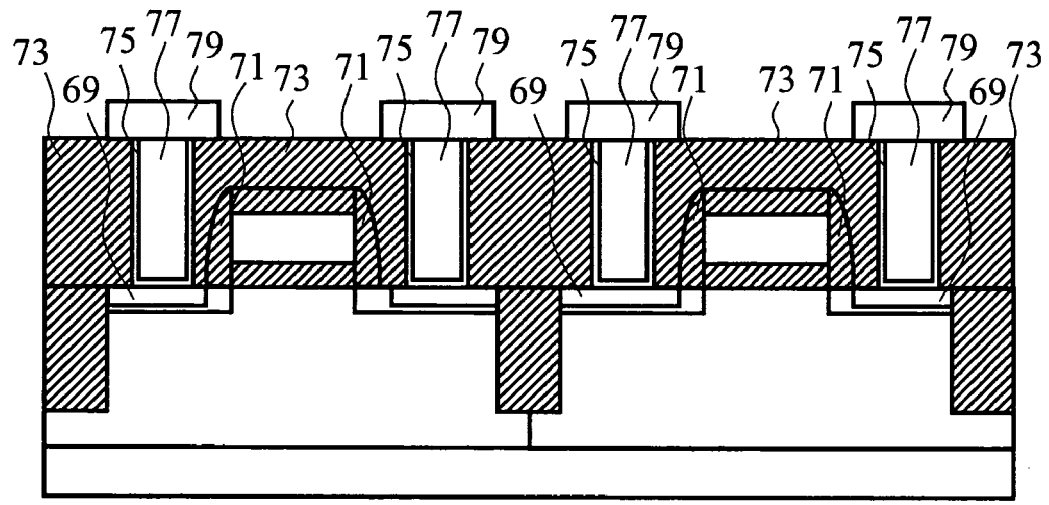

FIG. 11A and FIG. 11B are the section views for explaining the manufacturing method of CMISFET and CMISFET manufactured by the manufacturing method according to the fifth embodiment of the invention.

First, isolation regions 43, the p-type well 45, the n-type well 47, the mixed film 49 and the Mo film 51 are formed on the Si substrate 41 like the second embodiment. Then, the silicon nitride films 61 and 63 are formed on the Mo film 51. Although boron (B) was introduced into the Mo film before forming the silicon nitride film on the Mo film in the second embodiment, this process is skipped in this embodiment.

Next, the region for the p-type MISFET is covered with the resist using a photolithography, and the ion implantation of the boron (B) is carried out only to the Si substrate 41 of the region for the n-type MISFET. Here, the dose amount is about $1 \times 10^{16}$ cm$^{-2}$, and energy is about 70 KeV. In this embodiment, since boron (B) is added after forming the silicon nitride film, it is necessary to make energy of ion implantation higher compared with the first embodiment. The amount of addition can be changed appropriately within a range in which the threshold value changes effectively. Diborane ($B_2H_6$) or decaborane ($B_{10}H_{14}$) can be used for the ion implantation of boron (B) instead of elementary boron (B).

Then, the silicon nitride film 61, the Mo films 57 and 59, and the mixed film 49 is etched using the resist, and processed into the shape of gates as expressed in FIG. 11A. Then, the portion exposed without being covered with the gate electrode 57 is etched by dilute hydrofluoric-acid solution, and the mixed film 49 is processed into the shape of the gate insulating film as expressed in FIG. 11A. It is also possible to perform these etching before addition of boron (B). Since boron (B) is added also into the region for the source/drain regions of the n-type MISFET in that case, it is desirable to reduce the amount of the addition.

Next, the ion implantation of arsenic (As) is carried out to the Si substrate 41 of the region for the n-type MISFET, and shallow source/drain impurity regions are formed. Then, after covering the region for the n-type MISFET with the resist, the ion implantation of $BF_2$ is carried out to the region for the p-type MISFET, and shallow source/drain impurity regions are formed. Then, the introduced boron (B) is diffused through the Mo film into the mixed film 49 which is the gate insulating film, and the compound of Hf and boron (B) is formed into the mixed film 49 by heat treatment at about 600 degrees centigrade and in nitrogen atmosphere.

Then, $SiO_2$ films 71 of the side walls of the gate electrode 57, and deep source/drain impurity regions are formed like the first embodiment. Then, heat-treatment is carried out at high temperature about 400 degrees centigrade or more in order to activate the introduced impurities. As for the heat treatment, it is desirable that it is short-time high temperature treatment for about 20 seconds at about 1000 degrees centigrade.

Then, as the first embodiment, $CoSi_2$ film 69, $SiO_2$ film 73, TiN films 75, the W films 77, and the laminated films 79 of Al layer and Cu layer are formed, and the formations of CMISFET of this embodiment and wirings connected to this CMISFET are completed as expressed in FIG. 11B.

In a case of a transformation of the above-explained method, arsenic (As) may be used instead of boron. That is, the above-mentioned process can be performed by using arsenic instead of using boron. In this transformation, arsenic is selectively introduced into the insulating film of the p-type MOSFET. Arsenic is not introduced into the insulating film of the n-type MOSFET.

Further, as metal element in order to generate negative charge, at least one of other group V elements and aluminum can be introduced into the insulating film of the p-type MOSFET. For example, phosphorous (P), antimony (Sb) or aluminum (Al) can be used instead of arsenic. Appropriate gas may be used in order to make the element adsorb.

FIG. 12A through FIG. 12D and FIG. 13 are section views for explaining the manufacturing method of CMISFET and CMISFET manufactured by the method according to the sixth embodiment of the invention.

Figure 12A:
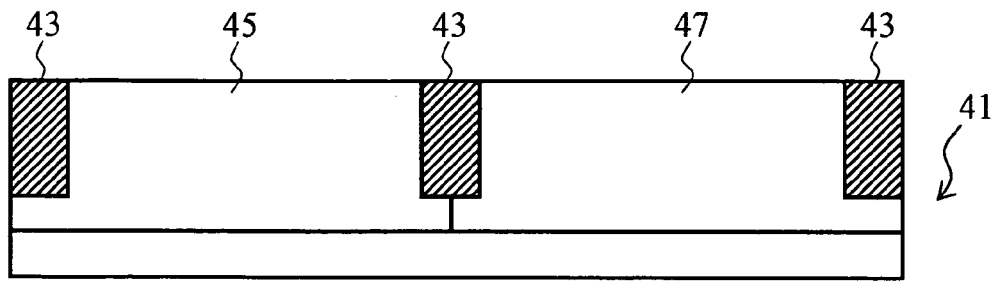
FIG. 12A through FIG. 12D are section views for explaining the manufacturing method of CMISFET according to the sixth embodiment of the invention.
Figure 12B:
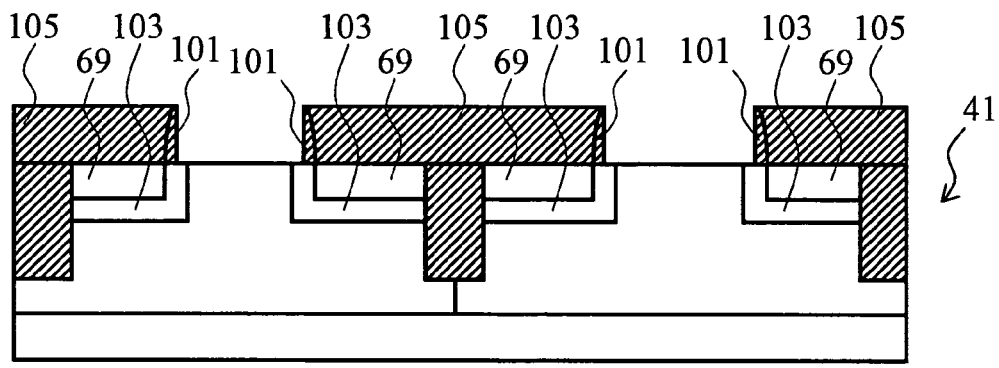
Figure 12C:
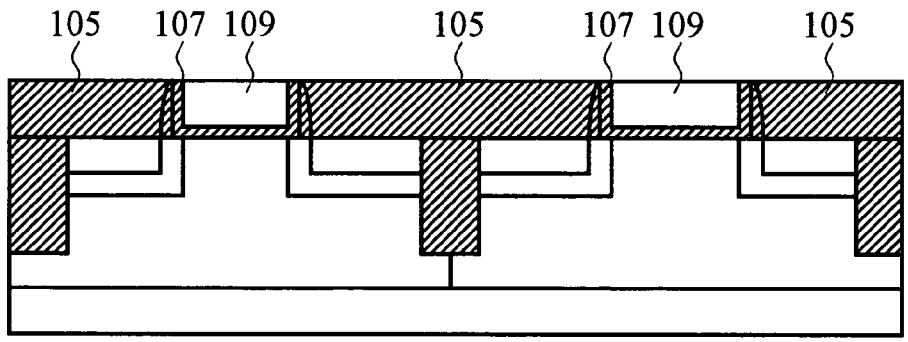

First, isolation regions 43, the p-type well region 45, and the n-type well region 47 are formed on the Si substrate 41 as the second embodiment as expressed in FIG. 12A. And, the ion implantation for adjustment of the threshold value is performed.

Then, the silicon oxide films used as dummy gate insulating films are formed on the surface of the Si substrate 41 with the thickness of about 4 nm. And, the polycrystalline silicon films used as dummy gate electrodes are formed on the silicon insulating film. The surface of Si substrates 41 other than the gate regions is exposed by processing the gate insulating films and the dummy gate electrodes into the gate form by a photolithography process. The impurity regions which are shallow and horizontally extended are formed on the surface of this exposed Si substrate 41 by ion implantation. Then, the silicon nitride films 101 are formed on the side walls of dummy gate electrodes.

And the deep source/drain impurity regions of transistors are formed by carrying out the ion implantation of As or $BF_2$ to the surface of the Si substrate 41 which is not covered with dummy gate electrodes and the side wall silicon nitride films 101 using them as a mask. Then, heat treatment is carried out at high temperature about 400 degrees centigrade or more in order to activate the introduced impurities. As for the heat treatment, it is desirable that it is short-time high temperature treatment for about 20 seconds at about 1000 degrees centigrade. And, source/drain regions 103 are formed as expressed in FIG. 12B. And, $CoSi_2$ film 69 is formed by the same method as the first embodiment as expressed in FIG. 12B.

Then, $SiO_2$ film is formed by the CVD method on the Si substrate 41. And $SiO_2$ film is shaved by CMP to the depth which the upper surfaces of the dummy gate electrodes expose. Then, the plasma polymerization by $CF_4$ removes the polycrystalline silicon of dummy gate electrodes. Furthermore, dilute hydrofluoric-acid solution removes dummy gate insulating films. Thereby, $SiO_2$ film 105 and the side wall silicon nitride films 101 used as insulating interlayer films are left behind on the Si substrate 41 as expressed in FIG. 12B.

Then, the ion implantation for the adjustment of the threshold value is performed onto the Si substrate 41 directly under the gates. Then, the mixed film of a hafnium oxide and a silicon oxide used as a gate insulating film is formed on the Si substrate 41 with the thickness of about 4 nm by the MOCVD method at about 500 degrees centigrade. The mixed film can be formed by the same method as the mixed film 49 of the first embodiment. Then, nitrogen is introduced into the mixed film by exposing the surface of the mixed film to nitrogen plasma. This nitride processing can be omitted.

Then, Mo film is formed on the mixed film by the CVD method using the halogen gas of Mo or the gas of an organic system. And Mo film and the mixed film on $SiO_2$ film 105 are removed by the CMP method. The gate insulating films 107 consisted of the mixed films and the gate electrodes 109 of Mo are formed as expressed in FIG. 12C.

Figure 12D:
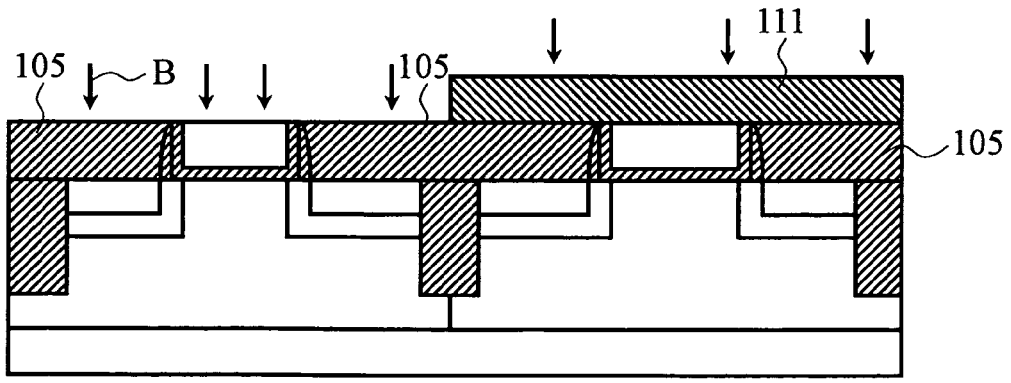
Figure 13:
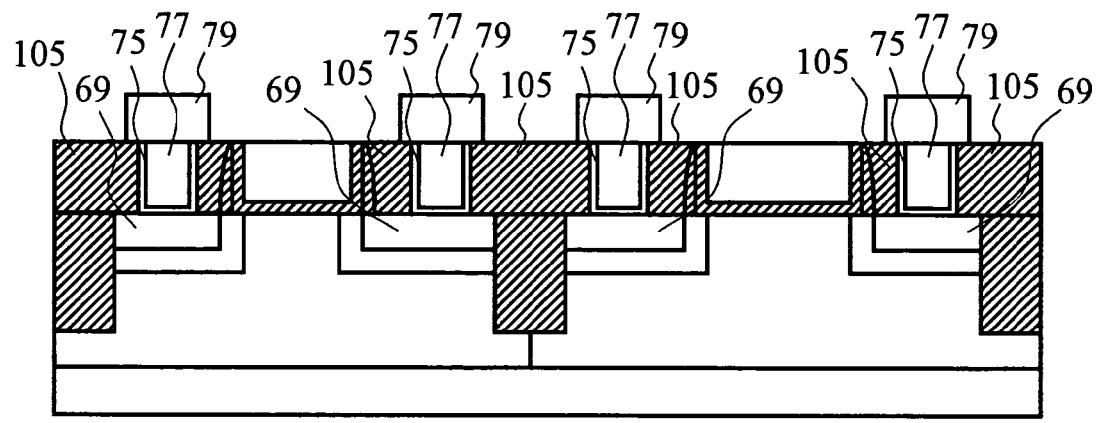
FIG. 13 is a section view for explaining the manufacturing method of CMISFET according to the sixth embodiment of the invention.

And after forming the resist 111 covering only the region for the p-type MISFET, the ion implantation of boron (B) is carried out to the whole surface as expressed in FIG. 12D. Thereby, boron (B) is added in only the gate electrode 109 and $SiO_2$ film 105 of the circumference of the region for the n-type MISFET region. Here, the dose amount is about $1 \times 10^{16}$ $cm^{-2}$, and energy is about 50 KeV. This condition can be changed appropriately within the range in which the threshold value of the n-type MISFET can change effectively. Moreover, diborane ($B_2H_6$) or decaborane ($B_{10}H_{14}$) can be used instead of elementary boron (B) as expressed in FIG. 12D.

Then, ashing etc. removes the resist 111 on the region for the p-type MISFET. Then, heat treatment at about 600 degrees centigrade is carried out, and boron (B) contained in the gate electrode 109 is made to diffuse in the gate insulating film 107 and to react with Hf in the gate insulating film 107. By this reaction, positive charge can be formed into the gate insulating film.

Then, the openings which result in CoSi$_2$ film 69 of the pairs of source/drain of MISFETs are formed in SiO$_2$ film 105 as the first embodiment. Then, the TiN films 75 which are barrier metals, the W films 77, and the laminated films 79 of aluminum layer and Cu layer are formed as expressed in FIG. 13. Formations of CMISFET of this embodiment and of the wiring which connects to CMISFET are finished.

According to the method of this embodiment, it becomes possible to use a material of low heat-resistant for the gate insulating film since the gate insulating film is formed after the high temperature heat treatment for activation of the source/drain impurities.

In a case of a transformation of the above-explained method, arsenic (As) may be used instead of boron. That is, the above-mentioned process can be performed by using arsenic instead of using boron. In this transformation, arsenic is selectively introduced into the insulating film of the p-type MOSFET. Arsenic is not introduced into the insulating film of the n-type MOSFET.

Further, as metal element in order to generate negative charge, at least one of other group V elements and aluminum can be introduced into the insulating film of the p-type MOSFET. For example, phosphorous (P), antimony (Sb) or aluminum (Al) can be used instead of arsenic.

Heretofore, the embodiments of the present invention have been explained, referring to the examples. However, the present invention is not limited to these specific examples.

For example, the material which has the work function at which the threshold value of the p-type MISFET can be set up appropriately, i.e., the material with the work function near about 5 eV, can be used as the gate electrode material besides Mo. For example, Co, Ni, Pt, Cu, Pd, W, Pt, Cu, Pd, W, PtSi, Pd$_2$Si, NiSi, etc. can be used.

Figure 14:
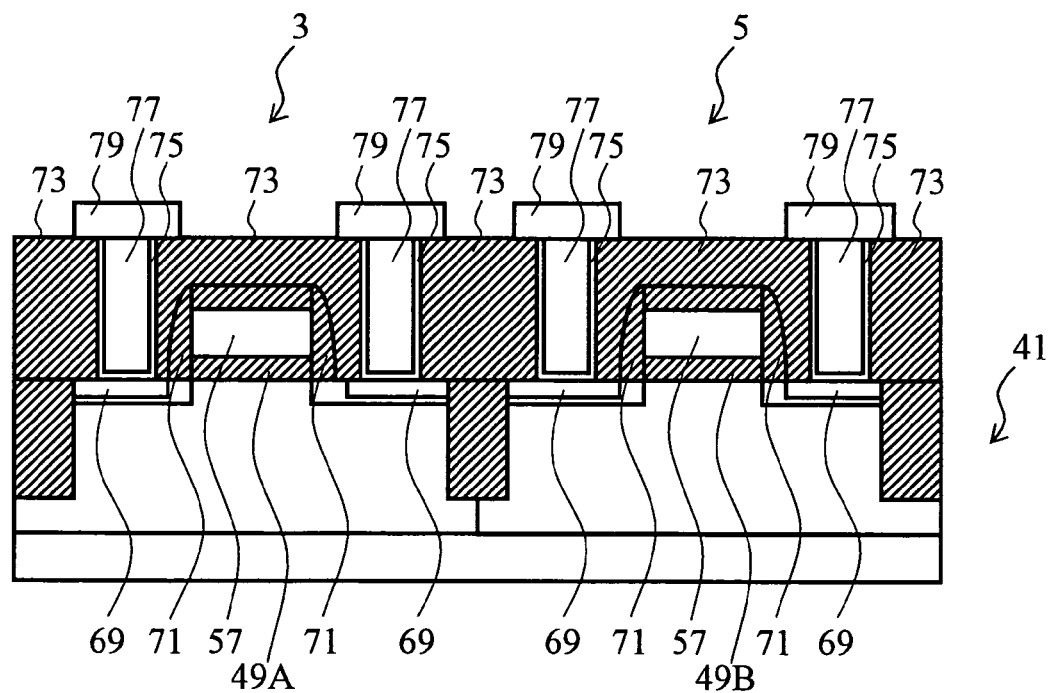
FIG. 14 is a section view showing CMISFET according to another embodiment of the invention.

The material of the gate electrode of the n-type MISFET and the material of the gate electrode of the p-type MISFET may be made to be different each other. For example, in the case of the CMISFET shown in FIG. 14, the gate electrode 57 of the n-type MISFET 3 may be made of chromium (Cr) while the gate electrode 59 of the p-type MISFET 5 may be made of tungsten (W). In this case, group III element (except aluminum) such as boron (B) is incorporated in the gate electrode 57, for example. Boron (B) has appropriately moved into the gate insulating film 49A, and forms a compound with group IV element such as hafnium (Hf) or lanthanide metal included therein. Thus, positive charge is generated and the threshold of the n-type MISEFT 3 can be appropriately adjusted.

With regard to the material of the gate insulating film, HfO$_2$ can also be used as the gate insulating film besides the mixed film of HfO$_2$ and silicon oxide. Furthermore, it is not limited to these films. And ZrO$_2$, the mixed film of ZrO$_2$ and the oxide of silicon, TiO$_2$, the mixed film of TiO$_2$ and the oxide of silicon, the oxide of the lanthanoid metal like La$_2$O$_3$ etc., the mixed film of the oxide of the lanthanoid metal like La$_2$O$_3$ etc. and the oxide of silicon can also be used as the gate insulating film. Moreover, the mixed film of the oxide of lanthanoid metal and Al$_2$O$_3$ can be used.

Moreover, the group III elements besides B, for example, Ga, In, etc., can be used as a metal to generate positive charge by combining with the metal of the gate insulating film of the n-type MISFET.

On the other hand, at least one of the group IV elements and aluminum can be used as a metal to generate negative charge by combining with the metal of the gate insulating film of the p-type MISFET.

Moreover, the gate insulating film may be formed by the CVD method of a halide system, the sputtering method, the vapor-depositing method, the ablation method, the applying method, or the other methods besides the MOCVD method. Moreover, radical or light may be irradiated at the time of the formation. Plasma can also be used when nitriding the gate insulating film. In that case, plasma may be formed in the chamber which lays the substrate and the plasma formed in piping linked to the chamber may be introduced in the chamber which lays the substrate. Moreover, the gate insulating film may be formed not by the nitride of plasma but by the CVD method in the atmosphere containing NH$_3$. Moreover, after forming the gate insulating film, heat-treatment may be performed in NH$_3$. Furthermore, nitrogen can also be introduced into the gate insulating film by low acceleration ion implantation.

Moreover, introduction of the impurities of the source/drain regions can also be performed by forming Si film added impurities on the source/drain regions of the substrate and diffusing impurities from the Si film besides ion implantation. Or the diffusion from SiO$_2$ and SiON of the gate side walls added impurities can also be used.

Other silicide material, such as NiSi can also be used for the silicide layer of the source drain regions besides CoSi$_2$.

Moreover, SOI (Silicon On Insulator) substrate can be used as the substrate besides Si substrate. Furthermore, the structure of MISFET can also be used for the MISFET in which current passes in parallel to the substrate but also the MISFET in which current passes in perpendicular to the substrate (for example, current is passed in the side of the Si on the surface of the substrate).

What is claimed is:

1. A complementary field effect transistor comprising:
   semiconductor substrate;
   an n-type field effect transistor provided on the semiconductor substrate having:
   a first gate insulating film containing an oxide including an element selected from the group consisting of group IV metals and Lanthanoid metals, and further containing a compound of the element and boron;
   a first gate electrode provided on the first gate insulating film; and
   n-type source and drain regions formed on both sides of the first gate electrode; and
   a p-type field effect transistor provided on the semiconductor substrate having:
   a second gate insulating film containing an oxide including an element selected from the group consisting of group IV metals and Lanthanoid metals, and substantially containing no boron;
   a second gate electrode provided on the second gate insulating film; and
   p-type source and drain regions provided on both sides of the second gate electrode.

2. The complementary field effect transistor according to claim 1, wherein a main component of the first gate electrode and a main component of the second gate electrode are the same.

3. The complementary field effect transistor according to claim 1, wherein the first and the second gate electrodes consist of one of Mo, Co, Ni, Pt, Cu, Pd, W, PtSi, Pd$_2$Si and NiSi, or an alloy including one of Mo, Co, Ni, Pt, Cu, Pd, and W.

4. The complementary field effect transistor according to claim 1, wherein a concentration of the compound in the first gate insulating film is higher on a side of the first gate electrode than on a side of the semiconductor substrate.

5. The complementary field effect transistor according to claim 1, wherein the first gate insulating film includes positive charge.

6. The complementary field effect transistor according to claim 5, wherein a concentration of the positive charge in the first gate insulating film is higher on a side of the first gate electrode than on a side of the semiconductor substrate.

7. The complementary field effect transistor according to claim 1, wherein the first gate electrode includes boron.

8. A complementary field effect transistor comprising:
a semiconductor substrate;
an n-type field effect transistor provided on the semiconductor substrate having:
a first gate insulating film containing an oxide including an element selected from the group consisting of group IV metals and Lanthanoid metals, and substantially containing no arsenic;
a first gate electrode provided on the first gate insulating film; and
n-type source and drain regions formed on both sides of the first gate electrode; and
a p-type field effect transistor provided on the semiconductor substrate having:
a second gate insulating film containing an oxide including an element selected from the group consisting of group IV metals and Lanthanoid metals, and further containing a compound of the element and arsenic;
a second gate electrode provided on the second gate insulating film; and
p-type source and drain regions provided on both sides of the second gate electrode.

9. The complementary field effect transistor according to claim 8, wherein a main component of the first gate electrode and a main component of the second gate electrode are the same.

10. The complementary field effect transistor according to claim 8, wherein the first and the second gate electrodes consist of one of Mo, Co, Ni, Pt, Cu, Pd, W, PtSi, $Pd_2Si$ and NiSi, or an alloy including one of Mo, Co, Ni, Pt, Cu, Pd, and W.

11. The complementary field effect transistor according to claim 8, wherein a concentration of the compound in the second gate insulating film is higher on a side of the first gate electrode than on a side of the semiconductor substrate.

12. The complementary field effect transistor according to claim 8, wherein the second gate insulating film includes negative charge.

13. The complementary field effect transistor according to claim 12, wherein a concentration of the negative charge in the second gate insulating film is higher on a side of the second gate electrode than on a side of the semiconductor substrate.

14. The complementary field effect transistor according to claim 8, wherein the second gate electrode includes arsenic.

* * * * *